United States Patent
Myers

(10) Patent No.: US 11,586,251 B2
(45) Date of Patent: *Feb. 21, 2023

(54) ELECTRONIC DEVICE WITH FLEXIBLE DISPLAY STRUCTURES

(71) Applicant: Apple Inc., Cupertino, CA (US)

(72) Inventor: Scott A. Myers, Saratoga, CA (US)

(73) Assignee: Apple Inc., Cupertino, CA (US)

( * ) Notice: Subject to any disclaimer, the term of this patent is extended or adjusted under 35 U.S.C. 154(b) by 4 days.

This patent is subject to a terminal disclaimer.

(21) Appl. No.: 17/322,762

(22) Filed: May 17, 2021

(65) Prior Publication Data

US 2021/0274662 A1 Sep. 2, 2021

Related U.S. Application Data

(63) Continuation of application No. 16/797,424, filed on Feb. 21, 2020, now Pat. No. 11,044,822, which is a continuation of application No. 15/840,750, filed on Dec. 13, 2017, now Pat. No. 10,602,623.

(60) Provisional application No. 62/442,318, filed on Jan. 4, 2017.

(51) Int. Cl.
| | |
|---|---|
| *H05K 5/00* | (2006.01) |
| *G06F 1/16* | (2006.01) |
| *H05K 5/02* | (2006.01) |
| *H05K 1/18* | (2006.01) |
| *G09G 3/20* | (2006.01) |
| *G06F 3/041* | (2006.01) |

(52) U.S. Cl.
CPC ............ *G06F 1/1652* (2013.01); *G06F 3/041* (2013.01); *G09G 3/2096* (2013.01); *H05K 1/181* (2013.01); *H05K 5/0017* (2013.01); *H05K 5/0217* (2013.01); *G06F 2203/04102* (2013.01); *G09G 2354/00* (2013.01); *G09G 2370/16* (2013.01); *G09G 2380/02* (2013.01)

(58) Field of Classification Search
USPC ................................ 361/752, 728, 796, 800
See application file for complete search history.

(56) References Cited

U.S. PATENT DOCUMENTS

| | | |
|---|---|---|
| 7,463,238 B2 | 12/2008 | Funkhouser et al. |
| 8,174,628 B2 | 5/2012 | Matsushita et al. |
| 9,111,470 B2 | 8/2015 | Anderson |
| 9,460,643 B2 | 10/2016 | Hirakata et al. |
| 9,560,750 B2 | 1/2017 | Lee |

(Continued)

*Primary Examiner* — Hung S. Bui
(74) *Attorney, Agent, or Firm* — Treyz Law Group, P.C.; G. Victor Treyz; David K. Cole

(57) ABSTRACT

An electronic device may have a flexible display. The electronic device may have housing portions that are rotatably coupled to each other so that the flexible display may fold along one or more bend axes. A device may have rollers that store a flexible display and that help deploy the display from within a housing when additional display area is desired. A touch screen in a housing may be overlapped by a flexible display that has been scrolled outwardly from the housing. Wireless transmitter and receiver circuitry may be used to convey image data to display driver circuitry. The display driver circuitry may display images on a pixel array in a flexible display based on the image data. Magnets may be used to outwardly bias edge-mounted bistable support structures to help prevent a rolled flexible display from wrinkling.

18 Claims, 14 Drawing Sheets

(56) References Cited

U.S. PATENT DOCUMENTS

| | | | |
|---|---|---|---|
| 9,684,340 B2 | 6/2017 | Han et al. | |
| 9,954,985 B2* | 4/2018 | Xu | |
| 10,602,623 B1* | 3/2020 | Myers | H04M 1/0268 |
| 11,044,822 B2* | 6/2021 | Myers | G09F 9/301 |
| 2002/0070910 A1 | 6/2002 | Fujieda et al. | |
| 2006/0192726 A1 | 8/2006 | Huitema et al. | |
| 2008/0049003 A1 | 2/2008 | Hasegawa | |
| 2008/0086925 A1 | 4/2008 | Yang et al. | |
| 2010/0220060 A1 | 9/2010 | Kobayashi | |
| 2011/0192857 A1 | 8/2011 | Rothbaum et al. | |
| 2013/0058063 A1 | 3/2013 | O'Brien | |
| 2013/0342094 A1 | 12/2013 | Walters et al. | |
| 2014/0194165 A1 | 7/2014 | Hwang | |
| 2014/0204037 A1 | 7/2014 | Kim | |
| 2014/0247544 A1 | 9/2014 | Ryu | |
| 2014/0340299 A1 | 11/2014 | Lee et al. | |
| 2016/0163242 A1 | 6/2016 | Lee et al. | |
| 2016/0209879 A1 | 7/2016 | Ryu et al. | |
| 2016/0216737 A1 | 7/2016 | Hayk et al. | |
| 2016/0349971 A1 | 12/2016 | Chi et al. | |
| 2017/0027067 A1 | 1/2017 | Choi et al. | |
| 2017/0060183 A1 | 3/2017 | Zhang et al. | |
| 2017/0123536 A1 | 5/2017 | Aurongzeb et al. | |
| 2017/0156219 A1 | 6/2017 | Heo et al. | |

\* cited by examiner

ELECTRONIC DEVICE WITH FLEXIBLE DISPLAY STRUCTURES

This application is a continuation of U.S. patent application Ser. No. 16/797,424, filed Feb. 21, 2020, which is a continuation of U.S. patent application Ser. No. 15/840,750, filed Dec. 13, 2017, now U.S. Pat. No. 10,602,623, which claims the benefit of provisional patent application No. 62/442,318, filed Jan. 4, 2017, which are hereby incorporated by reference herein in their entireties.

BACKGROUND

This relates generally to electronic devices, and, more particularly, to electronic devices with displays.

Electronic devices such as laptop computers, cellular telephones, and other equipment are often provided with displays. Displays contain arrays of pixels that present images to a user. Displays are often formed from rigid structures such as glass substrates. This can make it challenging to form compact electronic devices with desired features.

SUMMARY

An electronic device may have a flexible display. The electronic device may have housing structure in which printed circuit boards, electrical components, and other structures are mounted. In some configurations, rollers may be mounted within an electronic device housing.

A flexible display may be wrapped around one or more rollers. In a stored position, the flexible display may be wrapped around a storage roller. Optional deployment rollers may be used to help deploy the display as the display is pulled out of the housing. A flexible display may be viewable through a transparent housing window before and after the flexible display is pulled out of the housing.

An electronic device may have first and second housing portions and a flexible display that can be either stored in one or both housing portions or that may be scrolled out to form a planar display surface that extends between housing portions. Elongated bistable support members may run along the edges of the display or may be overlapped by a central active area of the display to help stiffen and support the display in its extended position. Magnets may be used to outwardly bias edge-mounted bistable support structures and thereby help prevent a rolled flexible display from wrinkling.

The electronic device may have housing portions that are rotatably coupled to each other with hinges or other bendable structures so that the flexible display may fold along the bend axes. Magnets may be used to releasably couple the housing portions to each other. Movable support structures such as movable members coupled by springs or other flexible structures may be move between first and second positions. When the device is unfolded and the flexible display is planar and unfolded, the movable support structures may be moved towards the bend axis to support the flexible display. When the device is folded, the movable support structures may be moved away from the bend axis to help allow the flexible display and device to fold about the bend axis.

An electronic device may have both rigid and flexible displays. A rigid display such as a touch screen display may be mounted in the housing and may serve as a virtual keyboard. A flexible display that is stored on a roller in the housing may be pulled out from the display when it is desired to provide a user with expanded display area. The flexible display may have a first surface with a pixel array that displays images and an opposing second surface that serves as a protective outer covering layer when the flexible display overlaps the touch screen display. The flexible display may be supported at a diagonal angle with respect to the touch screen display or other suitable angle.

Wireless transmitter and receiver circuitry in an electronic device may be used to convey image data to display driver circuitry in the device. The display driver circuitry may display images on a pixel array in a flexible display in the device based on the image data.

Further features will be more apparent from the accompanying drawings and the following detailed description.

DETAILED DESCRIPTION

Electronic devices may be provided with displays. The displays may include flexible displays. Flexible displays may be bent about a bend axis to allow an electronic device to be folded and may be rolled around rollers. This allows the flexible display to be stored in an electronic device housing when a compact device arrangement is desired and to be pulled from within the electronic device housing when an enlarged display area is desired. An electronic device may incorporate both foldable and scrollable displays or may have foldable displays and/or scrollable displays in a housing that also includes one or more rigid displays.

Figure 1:
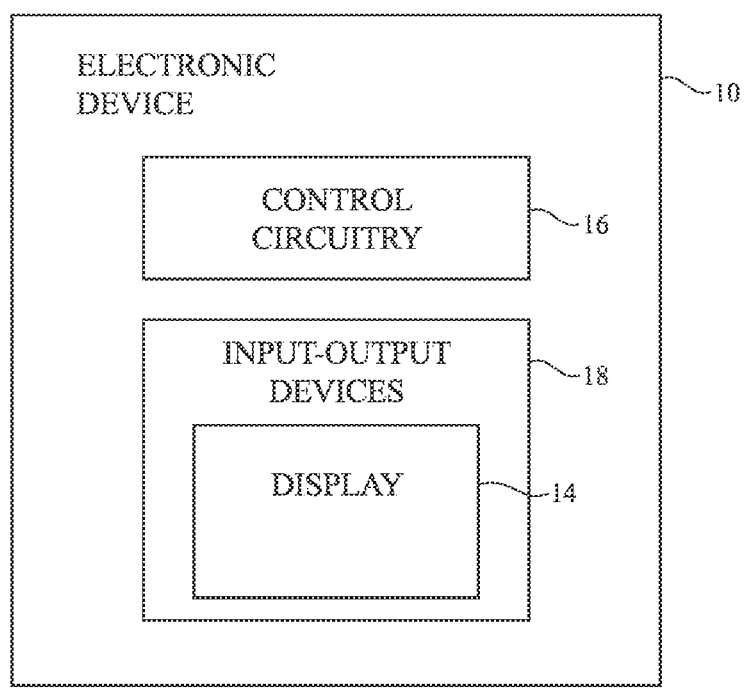
FIG. 1 is a schematic diagram of an illustrative electronic device having a display in accordance with an embodiment.

An illustrative electronic device of the type that may be provided with a flexible display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment.

As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 18 may be used to allow data to be supplied to device 10 and to allow data to be provided from device 10 to external devices. Input-output devices 18 may include buttons, joysticks, scrolling wheels, touch pads, key pads, keyboards, microphones, speakers, tone generators, vibrators, cameras, light-emitting diodes and other status indicators, data ports, etc. Input-output devices 18 may include sensors such as an ambient light sensor, a capacitive proximity sensor, a light-based proximity sensor, a magnetic sensor, an accelerometer, a force sensor, a touch sensor, a temperature sensor, a pressure sensor, a compass, a microphone or other sound sensor, or other sensors. A user can control the operation of device 10 by supplying commands through input-output devices 18 and may receive status information and other output from device 10 using the output resources of input-output devices 18.

Input-output devices 18 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Display 14 may be an organic light-emitting diode display or other light-emitting diode display, a liquid crystal display, a plasma display, an electrowetting display, an electrophoretic display, or other suitable display. Device 10 may include one or more flexible displays and/or rigid displays. A flexible display (e.g., an organic light-emitting diode display formed on a sheet of polymer or other flexible substrate and/or other flexible display pixel array structures) may be used to permit device 10 to be bent (e.g., folded) and/or to allow display 14 to be scrolled (e.g., to allow the visible area of display 14 to be expanded by moving display 14 in or out of a housing using a roller).

Figure 2:
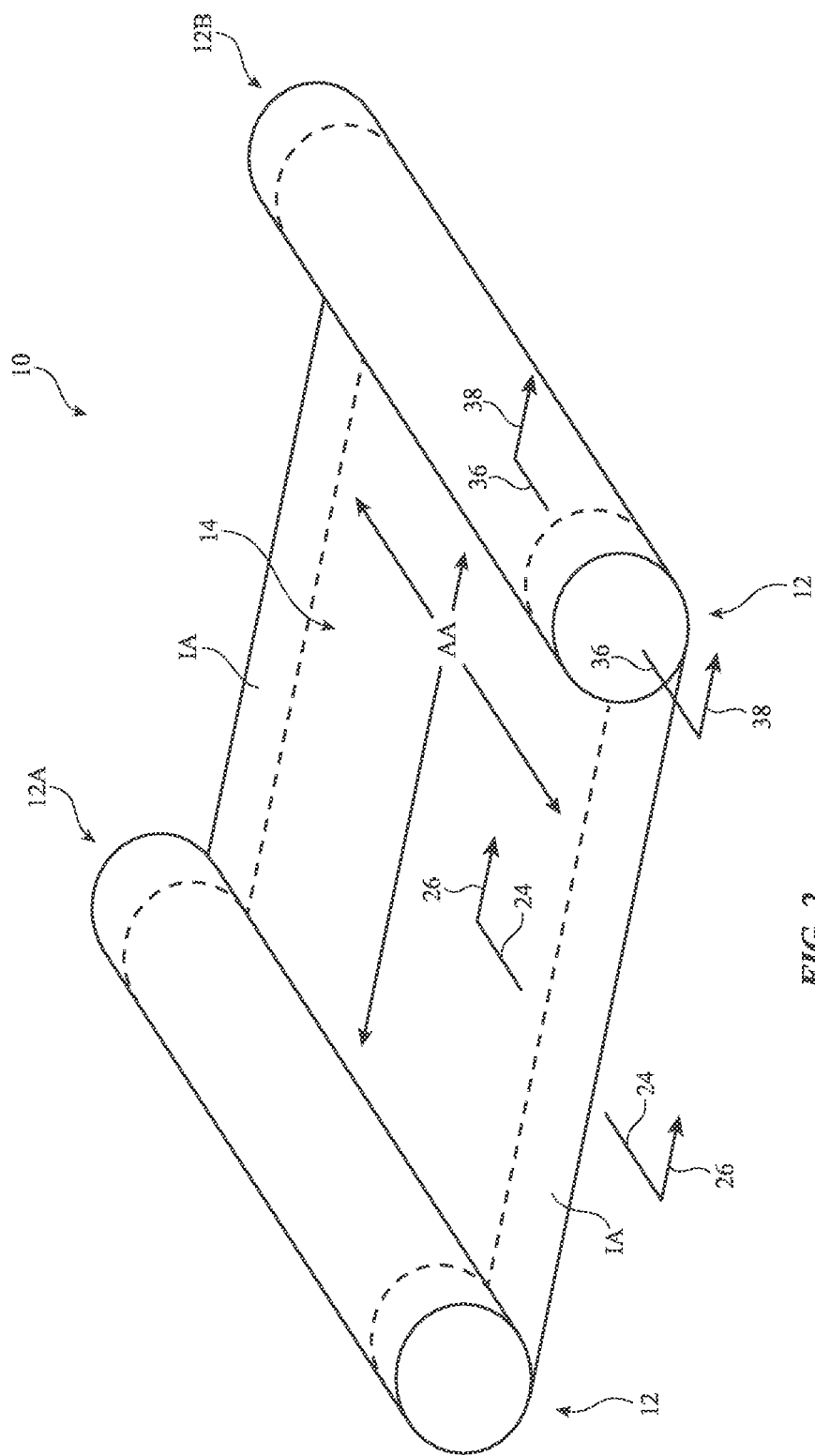
FIG. 2 is a perspective view of an illustrative device having with a flexible display extended between housing structures in accordance with an embodiment.

A perspective view of device 10 in an illustrative configuration in which device 10 has a housing 12 formed from two housing portions such as left housing portion 12A and right housing portion 12B and a scrolling flexible display 14 that extends between the left and right portions is shown in FIG. 2. Device housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing structures 12A and 12B may be formed using a unibody configuration in which some or all structures 12A and 12B are machined or molded as unitary structures or may be formed using multiple structures (e.g., an internal frame structure, one or more structures that form exterior housing surfaces, etc.). If desired, the housing of device 10 may have a single body (e.g., when device 10 is a cellular telephone, tablet computer, wristwatch device, etc.) or may have multiple body portions that are coupled by one or more hinges (e.g., in a laptop computer, a bifold or trifold device, or other device with foldable portions, etc.).

Housing structures 12A and/or 12B may be hollow. For example, housing structures 12A and/or 12B of FIG. 2 may contain internal rollers that allow display 14 to be rolled up and stored within housing structures 12A and 12B when display 14 is not in use. In this stored state, display 14 will be protected from damage. When it is desired to deploy display 14 for use, housing structures 12A and 12B may be pulled apart as shown in FIG. 2, thereby causing display 14 to scroll off of the internal roller(s) used to store display 14 within housing structures 12A and 12B.

Because display 14 is flexible in configurations of the type shown in FIG. 2, it may be desirable to provide display 14 with support structures. With one illustrative configuration, edge portions IA (e.g., inactive border strips of display 14 or other portions of display 14) may overlap bistable support structures such as strips of metal tape with curved cross sections. Central portion AA of display 14, which may sometimes be referred to as forming an active area of display 14, may have an array of pixels that displays images for a user and may or may not be supported by bistable support structures. The bistable support structures under inactive areas IA and/or under active area AA of display 14 may sometimes be referred to as bistable structures, bistable tape, or elongated bistable members. Bistable support structures may be formed from metal, plastic, or other suitable materials. Bistable support structures for display 14 may be stiff and supportive when deployed into the configuration of FIG. 2 while being flexible enough when sufficient bending force is applied to allow the bistable support structures to be rolled onto a roller when it is desired to retract display 14 into housing structures 12A and/or 12B.

Figure 3:
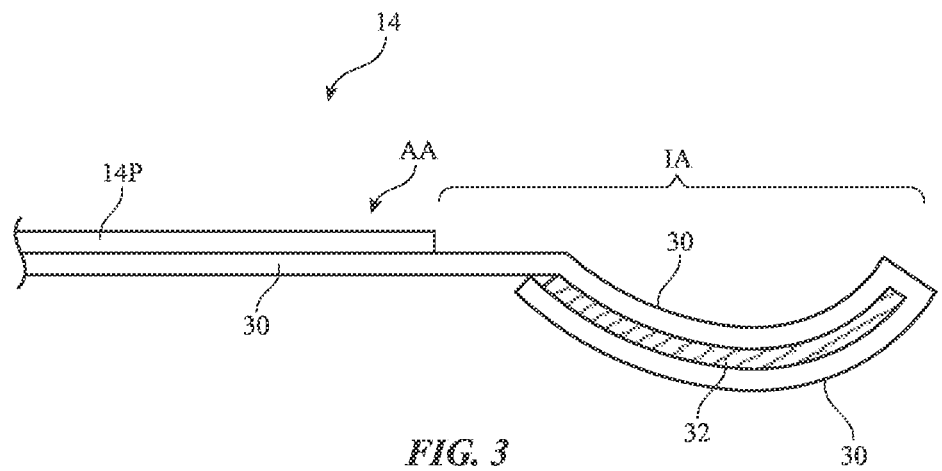
FIGS. 3 and 4 are cross-sectional side views of edge portions of illustrative electronic device displays in accordance with an embodiment.
Figure 4:
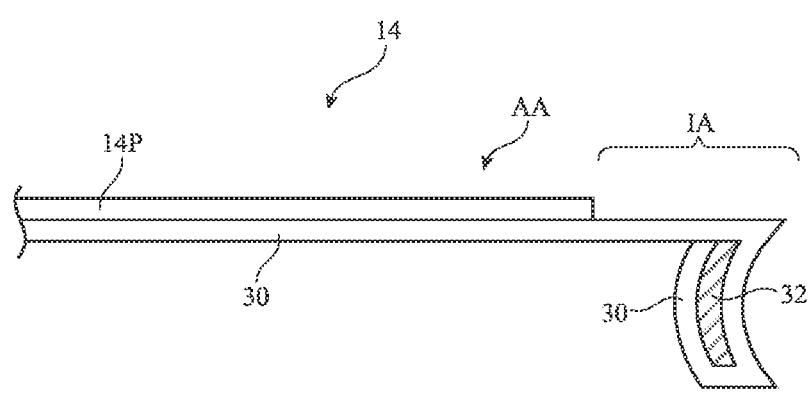

A cross-sectional view of an illustrative edge portion of display 14 taken along line 24 of FIG. 2 and viewed in direction 26 is shown in FIG. 3. As shown in FIG. 3, pixel array 14P (e.g., a flexible layer with an array of organic light-emitting diode pixels) may be located in central active area AA of display 14. Inactive area IA along the edges of display 14 may include substrate material 30 and bistable tape 32. Substrate material 30 may include, for example, one or more flexible polymer layers and may have a portion that is wrapped around bistable tape 32. FIG. 4 shows how bistable tape 32 may, if desired, lie in a plane that is perpendicular to the surface of display pixel array 14P.

Figure 5:
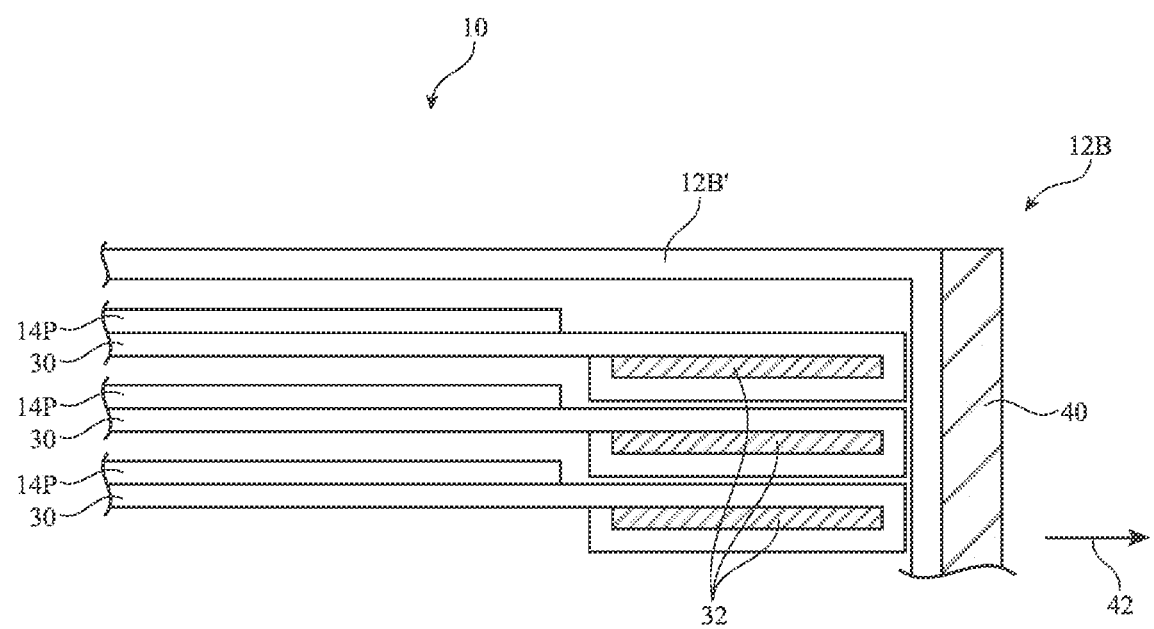
FIG. 5 is a cross-sectional view of a portion of an electronic device display that has a supporting member and a pixel array layer that are wrapped around an axis in accordance with an embodiment.

FIG. 5 is a cross-sectional side view of electronic device 10 of FIG. 2 taken along line 36 and viewed in direction 38. In the arrangement of FIG. 5, flexible pixel array 14P (e.g., an organic light-emitting diode display layer), supporting substrate 30 (e.g., a flexible polymer) and bistable tape 32 (e.g., metal tape such as ferromagnetic tape) have been rolled up for storage inside the interior of housing structures 12B. When wound around a roller as shown in FIG. 5, the cross-sectional curvature of tape 32 become flattened, allowing tape 32 to flex. Housing structures 12B may include structures such as housing wall 12B' that surround and enclose the rolled up substrate 30, pixel array 14P (display 14), and metal tape 32). As shown in FIG. 5, magnet 40 may be mounted on an end portion of wall 12B' (inside or outside of housing 12) and may magnetically attract metal tape 32. This pulls tape 32 outwardly in direction 42 and helps ensure that tape 32 remains near to the end of housing structures 12B, thereby preventing pixel array 14P and substrate 30 from wrinkling.

Figure 6:
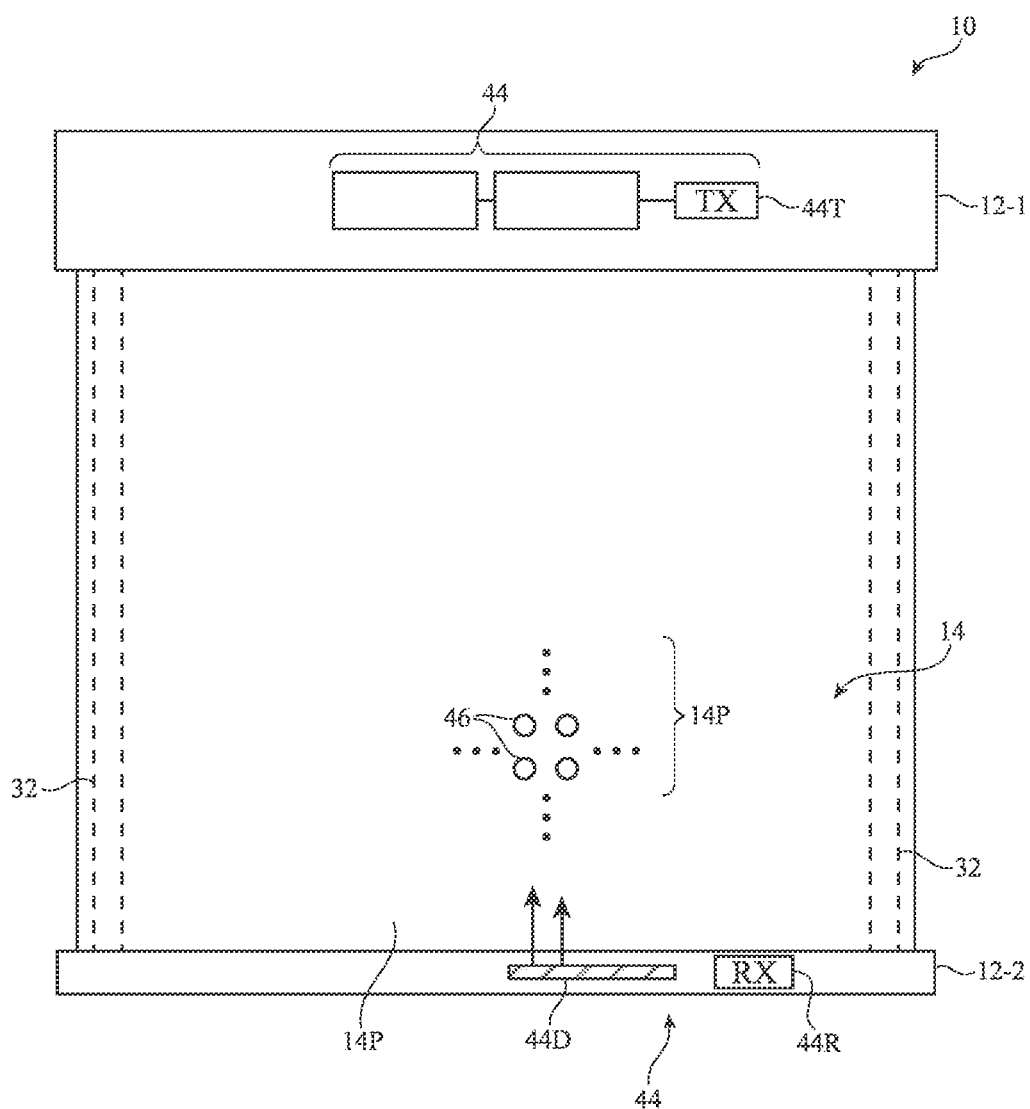
FIG. 6 is a top view of an illustrative electronic device with a flexible display and wireless circuitry in accordance with an embodiment.

FIG. 6 is a top view of device 10 in an illustrative configuration in which the housing for device 10 has a main portion (housing structure 12-1) and has a smaller portion (housing structure 12-2) that is used as a support bar to help pull flexible display 14 off of a roller within the interior of structures 12-1. Bistable support strips such as tape 32 may be used to help support flexible display 14 when flexible display 14 is in its deployed state as shown in FIG. 6.

Device 10 of FIG. 6 and the other FIGS. may include electrical components 44. Electrical components 44 may include integrated circuits, sensors, connectors, batteries, audio circuits, speakers, microphones, and other input-output devices and control circuitry. Electrical components 44 may be mounted on one or more substrates (e.g., printed circuits). Substrates for mounting components 44 may be formed from plastic, glass, ceramic, other dielectric materials, printed circuit structures (e.g., rigid printed circuits formed from fiberglass-filled epoxy or other rigid printed circuit material and/or flexible printed circuits formed from flexible layers of polyimide or sheets of other polymer substrate materials), or other substrate material.

Display 14 may have a pixel array such as pixel array 14P formed from pixels 46 (e.g., organic light-emitting diode pixels, etc.). Components 44 may include integrated circuits and/or thin-film transistor circuitry such as display driver circuitry 44D that is coupled to pixel array 14P of display 14 and that is used in providing data and control signals to pixels 46. If desired, display driver circuit 44D may be mounted in housing structure 12-2.

To reduce or eliminate signal lines that are bent during the scrolling of display 14, components 44 may include wireless communications circuitry such as wireless communications circuits 44T and 44R. During operation, image data from a processor or other control circuitry in structure 12-1 may be transmitted wirelessly by a wireless communications circuit transmitter in circuit 44T (a wireless transmitter circuit) and may be received by corresponding a wireless communications receiver in circuit 44R (a wireless receiver circuit). If desired, touch sensor signals may be gathered using a component 44 in housing structure 12-2 and transmitted wirelessly back to a processor in housing structure 12-1 (e.g., circuit 44R may include a wireless transmitter and circuit 44T may include a corresponding wireless receiver).

Figure 7:
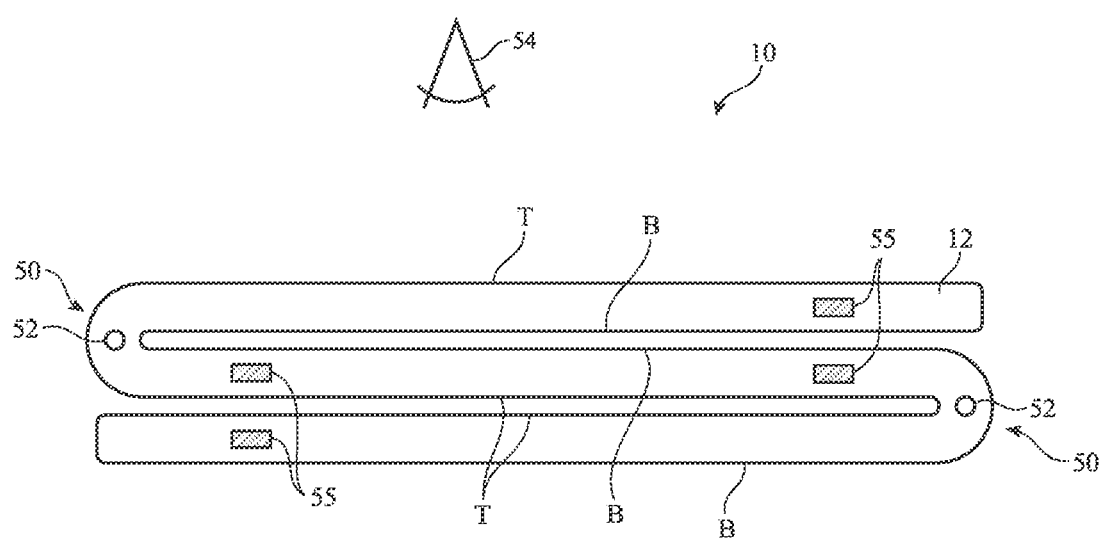
FIG. 7 is a side view of an illustrative trifold electronic device in accordance with an embodiment.

In the illustrative example of FIG. 7, electronic device 10 has a foldable configuration. As shown in FIG. 7, device 10 may have a housing such as housing 12 with bend regions 50. In general, device 10 may have any suitable number of bend region 50 (e.g., one or more, two or more, three or more, etc.). FIG. 7 shows how there may be two bend regions 50 in housing 12, so that housing 12 may be folded in a trifold configuration (e.g., a configuration in which device 10 is made up of three overlapping planar housing portions). Bend facilitation structures 52 (e.g., voids, locally elastic structures, etc.) may be placed in housing 12 at bend regions 50 to facilitate folding of housing 12 and device 10 along bend axes aligned respectively with bend regions 50. Flexible displays 14 may be located on one or more of the surfaces of the portions of housing 12. For example, a first flexible display may cover some or all of surface T of housing 12 and/or a second flexible display may overlap some or all of opposing surface B of housing 12. Magnets 55, hinge detents, and/or other closure mechanisms may be used to help hold device 10 in its folded state. When a user such as viewer 54 desires to expand the visible portion of the flexible display, housing 12 and display(s) 14 may be unfolded and placed in a planar configuration in which each of the trifold sections of housing 12 and device 10 are coplanar.

Figure 8:
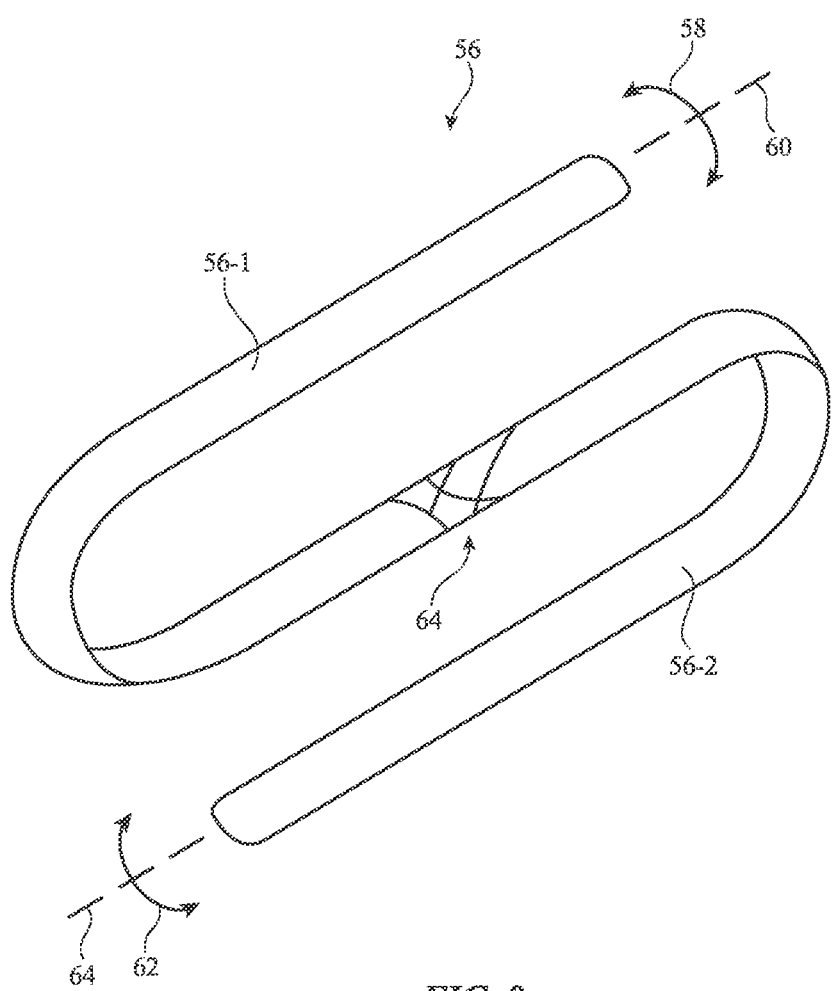
FIG. 8 is a perspective view of an illustrative support member formed from two oppositely oriented bistable strips in accordance with an embodiment.

If desired, bistable support structures such as illustrative bistable support member (metal tape) 56 may run along the edges of housing 12 of FIG. 7. Portion 56-1 of member 56 may be formed from metal or other suitable material with a cross-sectional shape that is curved downwards in direction 58 about axis 60 and portion 56-2 may have an opposite cross-sectional shape curvature (e.g., portion 56-2 may be formed from metal that is curved in direction 62 about axis 64). Adhesive, welds, fasteners, or other fastening structures may be used to join portions (segments) 56-1 and 56-2 of member 56 together at attachment region 64 as shown in FIG. 8 before assembling member 56 into housing 12 of FIG. 7.

Figure 9:
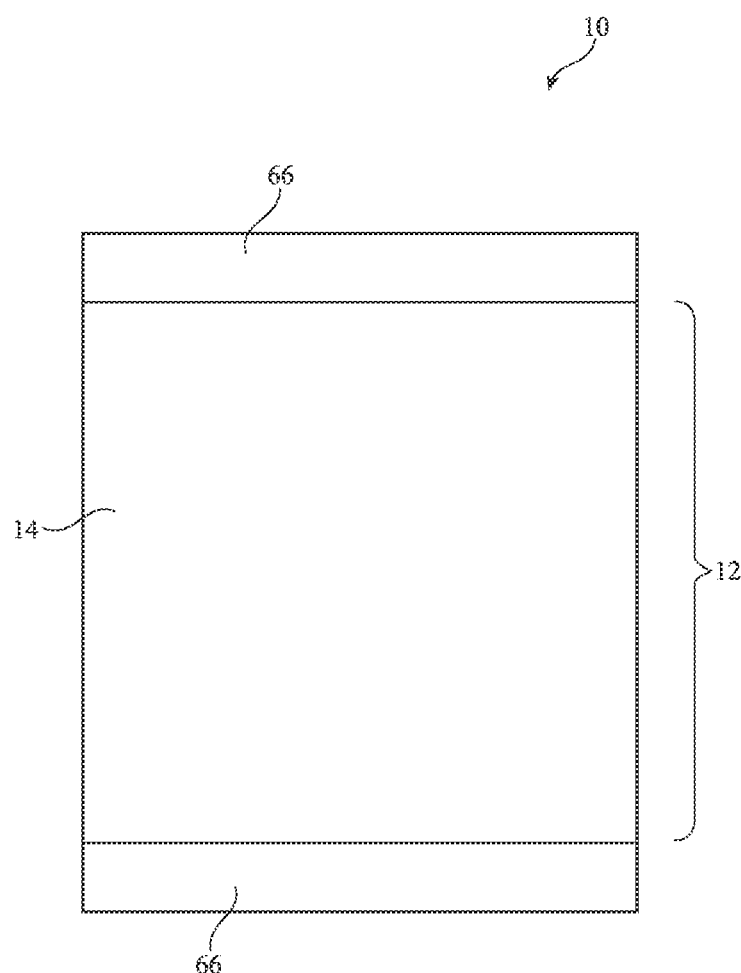
FIG. 9 is top view of an illustrative electronic device with a scrolling display and protective end caps in accordance with an embodiment.

FIG. 9 is a top view of device 10 in an illustrative configuration in which device 10 has protective end cap structures such as end caps 66. Flexible displays such as display 14 may be mounted on one or both sides of housing 12. Device 10 of FIG. 9 may, as an example, be a trifold device of the type shown in FIG. 7. When in a folded configuration of the type shown in FIG. 9, end caps 66 may be moved into a position that helps hold the folds of device 10 into place and thereby prevents unintentional unfolding.

Figure 10:
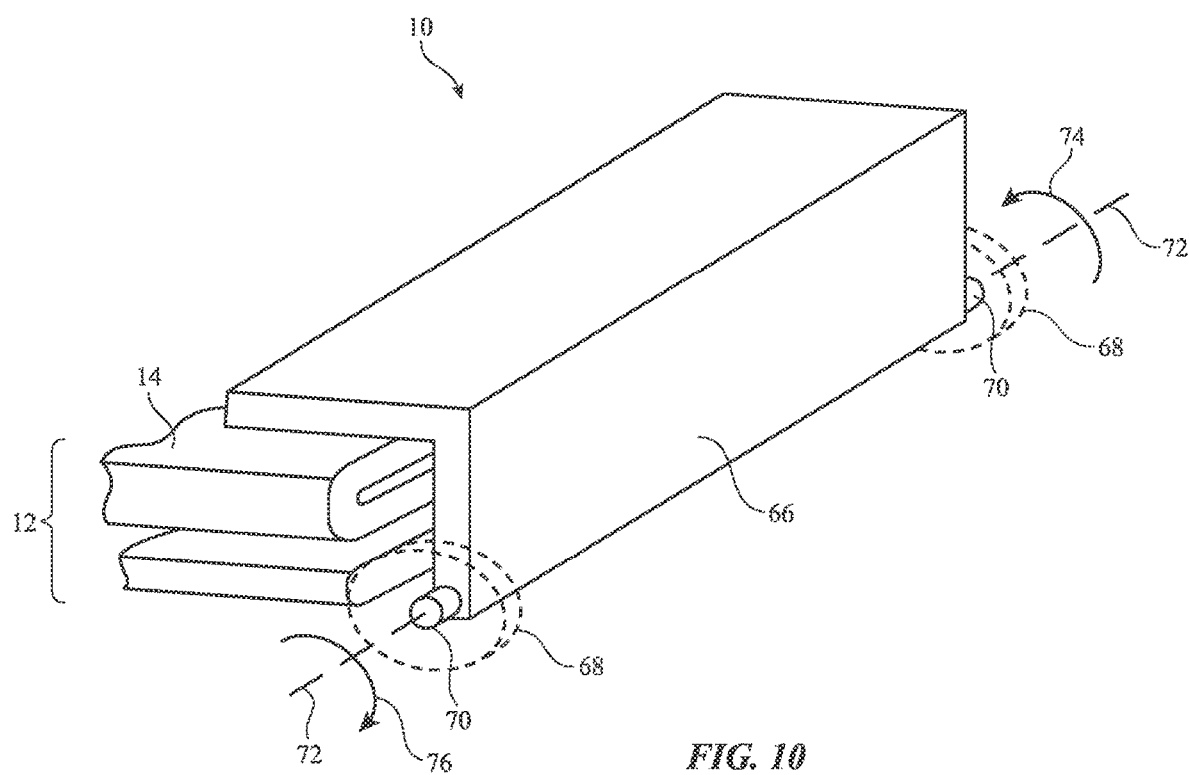
FIG. 10 is a perspective view of an illustrative end cap in accordance with an embodiment.

A perspective view of device 10 and an illustrative endcap 66 is shown in FIG. 10. As shown in FIG. 10, end cap 66 may be mounted on part of housing 12 such as portions 68. Protrusions 70 of end cap 66 may, for example, be received within portions 68 so that end cap 66 may be rotated about axis 72. End cap 66 may be rotated about axis 72 in direction 74 when it is desired to place end cap 66 in the display and housing retention position shown in FIG. 10 (e.g., to protect the edges of display 14 which might otherwise be exposed to damage) and may be rotated about axis 72 in direction 76 when it is desired to release display 14 and housing 12 and thereby allow device 10 to be unfolded.

Figure 11:
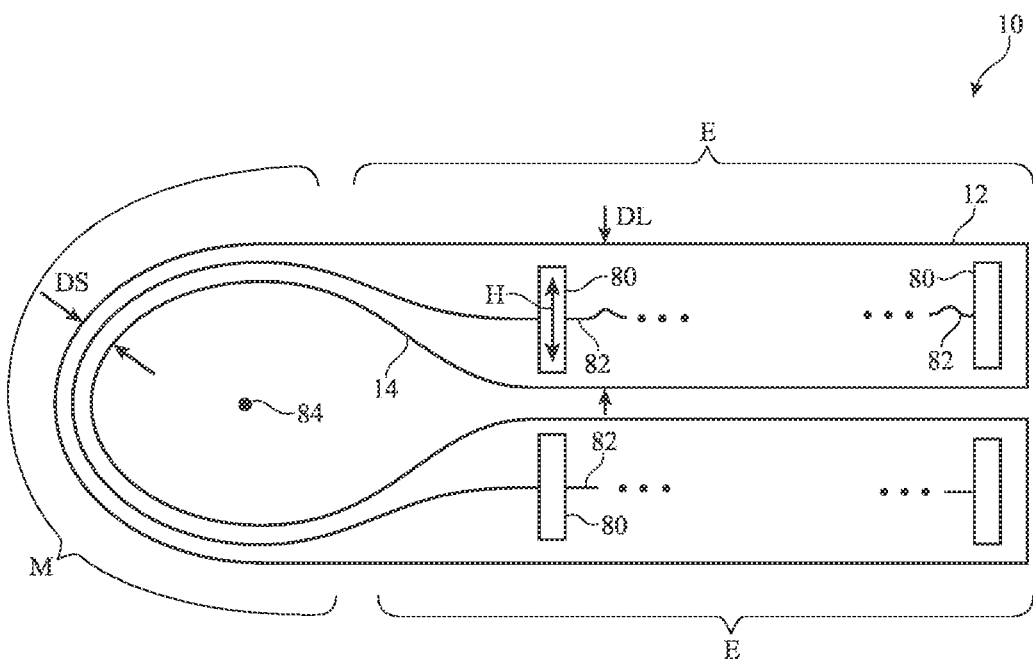
FIG. 11 is a cross-sectional side view of an illustrative electronic device in a folded configuration in accordance with an embodiment.

In the illustrative arrangement of FIG. 11, device 10 has planar portions E (e.g., left and right portions of housing 12) and a locally thinned interposed middle portion M. Movable supports 80 may be coupled using springs 82. Display(s) 14 may be formed on the upper and/or opposing lower surfaces of housing 12. Device 10 can be folded and unfolded to move supports 80 within housing 12. When device 10 is folded, portion M takes on a thickness DS that is less than the thickness DL of planar portions E. Supports 80 may have a height H that is between DS and DL or other suitable height. The thinning of middle portion M of housing 12 when the upper and opposing lower surfaces of device 10 in portion M are brought towards each other when device 10 is folded about bend axis 84 squeezes supports 80 out of region M along bend axis 84 and into regions E, as shown in FIG. 11. By moving supports 80 (e.g., rigid support members such as supporting structures formed from plastic, metal, etc.) outwardly into portions E, the flexibility of device 10 in region M is enhanced.

Figure 12:
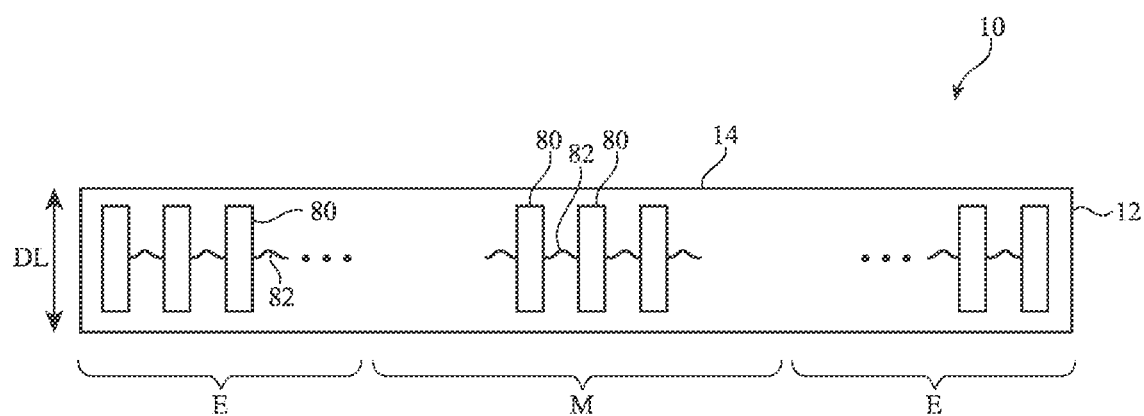
FIG. 12 is a cross-sectional side view of the illustrative electronic device of FIG. 11 in an unfolded configuration in accordance with an embodiment.

When device 10 is unfolded as shown in FIG. 12, middle region M becomes thicker (e.g., the thickness of middle region M may increase to thickness DL). This allows springs 82 to pull members 80 back into middle region M so that members 80 can support display 14 in a planar configuration in region M as shown in FIG. 12.

Figure 13:
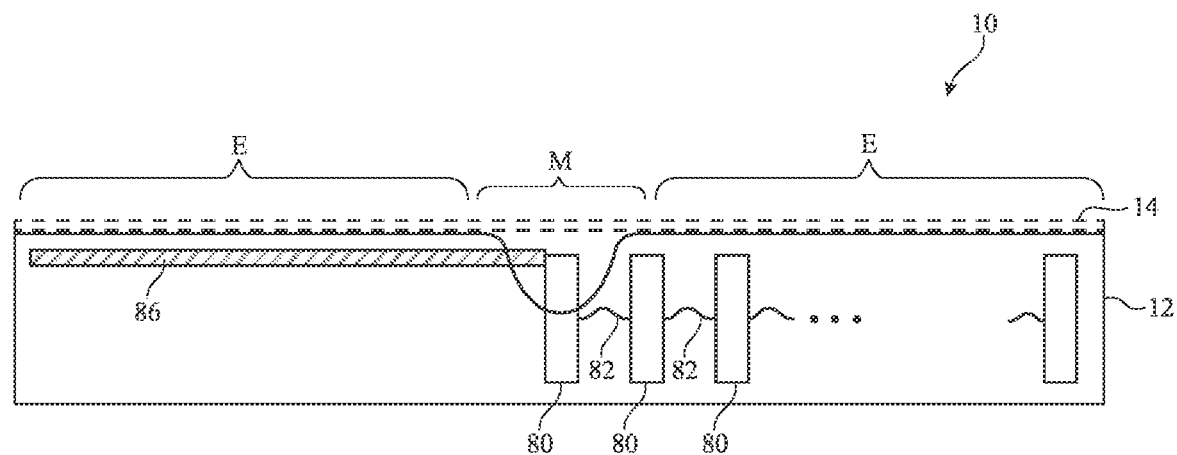
FIGS. 13 and 14 are cross-sectional side views of an electronic device with pushing members in respective unfolded and folded states in accordance with an embodiment.
Figure 14:
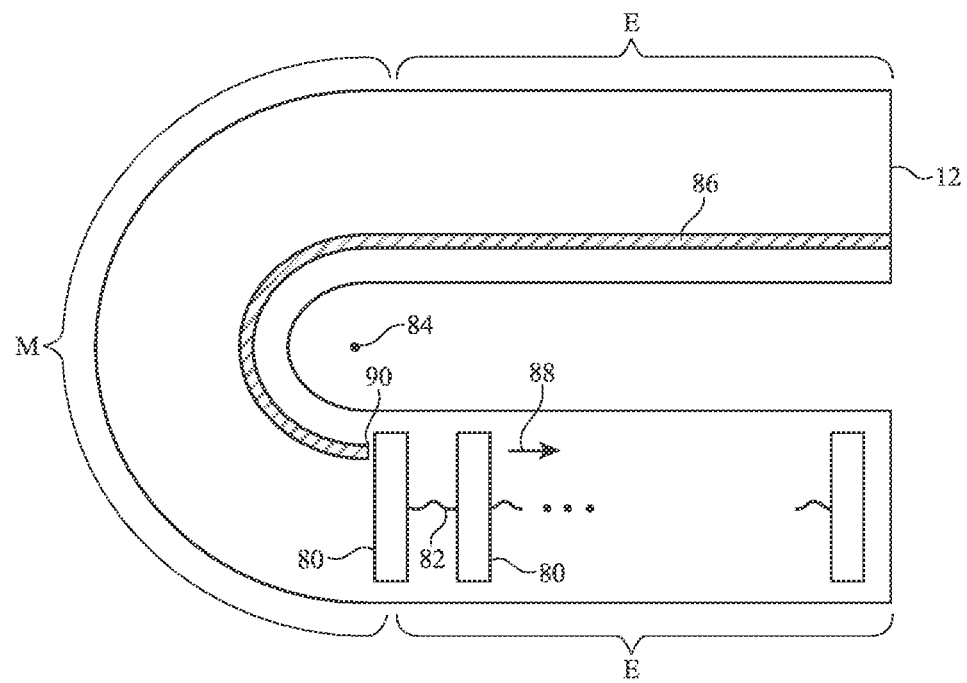

Another illustrative configuration for moving support members 80 within housing 12 is shown in FIGS. 13 and 14. In the unfolded arrangement of FIG. 13, supports 80 may be pulled into middle region M by springs 82. Biasing member 86, which may be formed from a layer of material or other structure that elongates when bent and thinned, may press against the edge of supports 80. When device 10 is folded about bend axis 84 as shown in FIG. 14, end 90 of biasing member 86 may push members 80 away from bend axis 84, out of middle region M, and into planar side region E in direction 88, as shown in FIG. 14. In the example of FIGS. 13 and 14, only a single left-hand biasing member 86 and single set of corresponding right-hand support members 80 are depicted. Device 10 may have both right and left biasing members and both right-hand and left-hand sets of support members 80 joined by springs 82 or other flexible structures.

Figure 15:
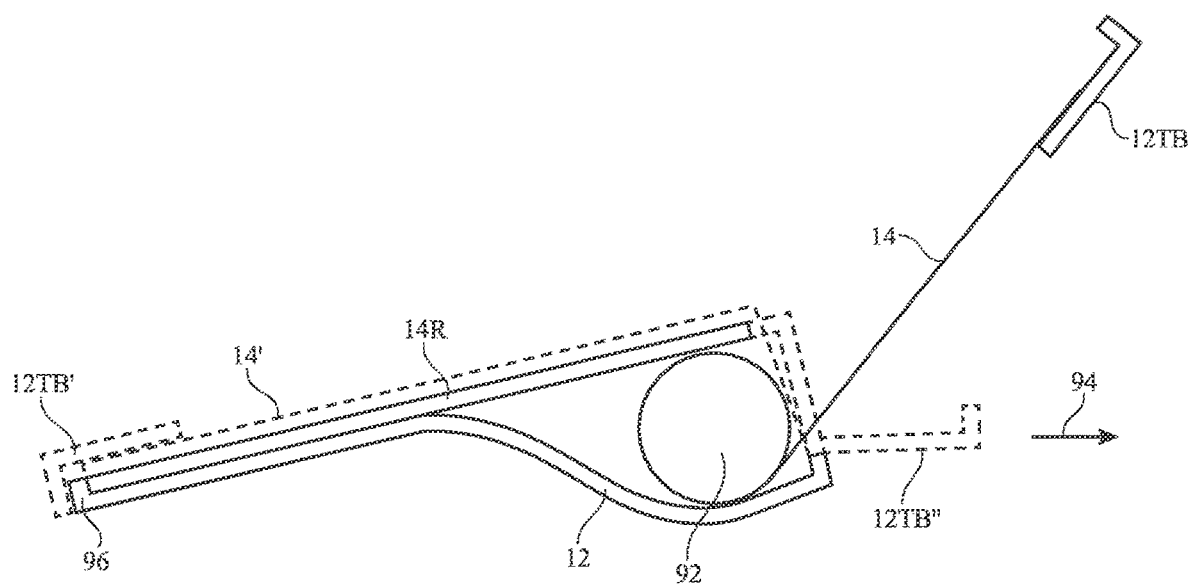
FIG. 15 is a side view of an illustrative electronic device with a scrolling flexible display and a rigid display such as a rigid touch screen display in accordance with an embodiment.

FIG. 15 is a cross-sectional side view of device 10 in an arrangement in which flexible display 14 may be scrolled and in which device 10 may contain a separate rigid display. Internal roller 92 in housing 12 may be used to store flexible display 14 when flexible display 14 is wrapped about roller 92 and may be used to deploy flexible display 14 when flexible display 14 is unwrapped from roller 92. Additional rollers may be provided in housing 12 if desired.

End portion 12TB of housing 12 may be used to help a user pull out the end of display 14 when unwrapping display 14. Portion 12TB may be pulled out diagonally (as shown in FIG. 15) or may be pulled in other directions. For example, portion 12TB may be pulled out horizontally from housing 12 in direction 94 as shown by portion 12TB". When deployed diagonally, display 14 may provide an expanded viewing area for a user (e.g., to display a document, web pages, and/or other content. Bistable metal strips or other support structures may be used to hold flexible display 14 in a desired position (e.g., in a position in which the display and bistable strips extend at an angle relative to housing 12 as shown in FIG. 15, etc.

A rigid display (e.g., a touch screen display) such as rigid display 14R may be mounted on the front of housing 12. A virtual keyboard (e.g., a QWERTY keyboard or other keyboard) may be dynamically formed on touch screen display 14R. Flexible display may be scrolled outwardly when pulled out from housing 12 and may be maintained at a desired angle (e.g., a diagonal angle or other suitable angle with respect to horizontal, as shown in FIG. 15). This allows display 14 to serve as an ancillary display (e.g., to display documents, internet content, etc.) while display 14R is serving as a virtual keyboard or other touch screen input device.

If desired, portion 12TB may be placed on end 96 of housing 12 as shown by portion 12TB' so that flexible display 14 lies in position 14'. In this arrangement, the back surface of flexible display 14 forms a protective cover for display 14R, while the pixels of flexible display 14 that lie on the opposing surface of display 14 may face inwardly towards display 14R. The outwardly facing rear (substrate) portion of display 14 may be free of sensitive pixel structures and may therefore serve as an outwardly facing protective surface for device 10 when display 14 is stowed in a position where pixel array 14P faces display 14R, thereby preventing display 14R from becoming scratched. Magnets, fasteners, or other attachment mechanisms may be used to secure portion 12TB' to housing end 96.

Figure 16:
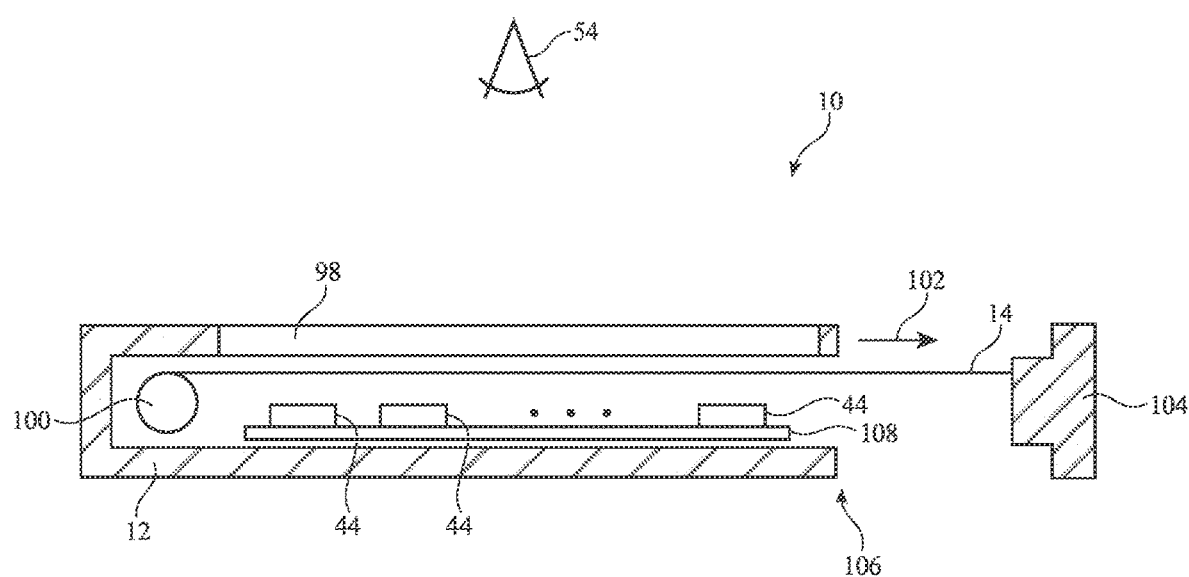
FIG. 16 is a cross-sectional side view of an illustrative electronic device with a scrolling display deployed from beneath a transparent housing window member in accordance with an embodiment.

Another illustrative arrangement for device 10 is shown in FIG. 16. With this configuration, a transparent window such as window 98 is formed in housing 12. One or more rollers such as roller 100 may be used to store flexible display 14 when display 14 is retracted into housing 12 and may be used to deploy flexible display 14 when display 14 is pulled outwardly in direction 102 using portion 104 of housing 12. In the retracted position, portion 104 of housing 12 may be retained at end 106 of housing 12. In this position, a viewer such as viewer 54 may view images on the portion of display 14 that is overlapped by window 98. When extended, images on the extended portion may be viewed direction and images of the portion of display 14 remaining under window 98 may be viewed through window 98. Window 98, which may sometimes be referred to as a transparent housing window or transparent display window, may be formed from transparent materials such as clear glass, clear plastic, clear ceramic, sapphire or other transparent crystalline material, or other suitable transparent material. Components 44 (e.g., integrated circuits, batteries, etc.) may be mounted on a printed circuit board such as printed circuit board 108 or other substrate.

Figure 17:
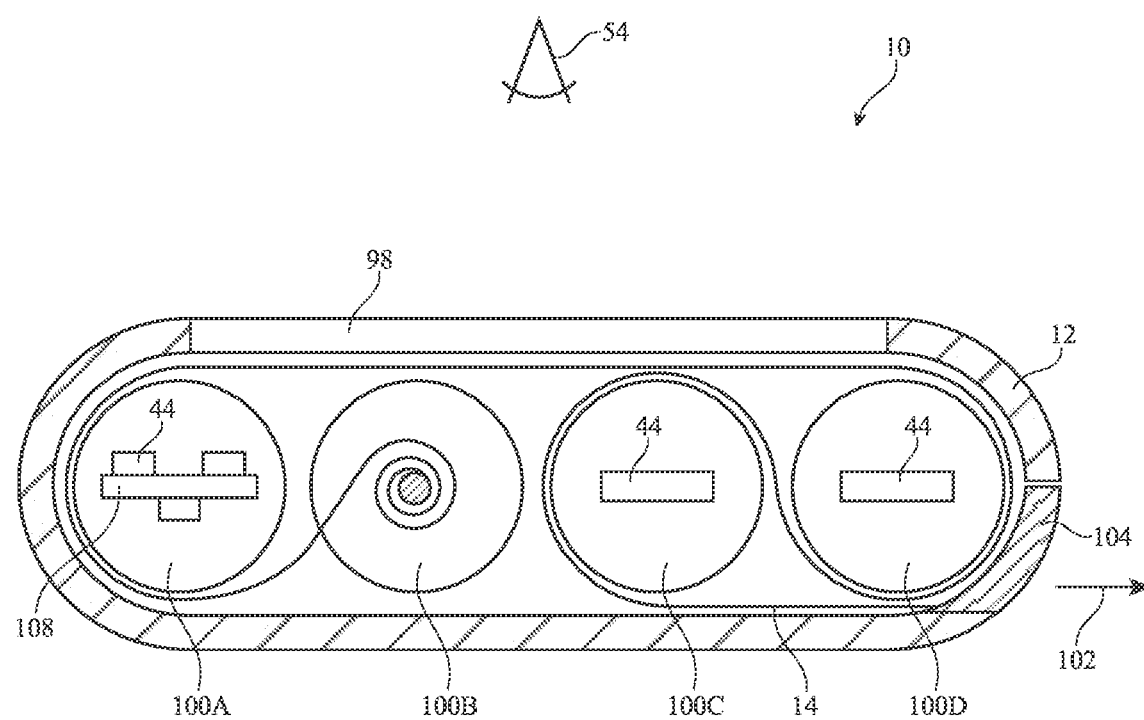
FIG. 17 is a cross-sectional side view of an illustrative electronic device with a scrolling flexible display deployed using multiple internal rollers in accordance with an embodiment.

As shown in FIG. 17, device 10 may have multiple rollers (e.g., two or more rollers, three or more rollers, four or more rollers, fewer than ten rollers, or other suitable number of rollers). In the example of FIG. 17, device 10 has four rollers: deployment rollers 100A, 100C, and 100D and storage roller 100B. When portion 104 of housing 12 is pulled away from device 10 in direction 102, flexible display 14 will scroll out of housing 12. A portion of display 14 that is overlapped by window 98 may be viewed after the remainder of display 14 has been pulled out of housing 12 to enlarge the effective viewing area for viewer 54. Because flexible display 14 follows a meandering path about the rollers in the interior of housing 12, the size of display 14 can be enhanced without overly enlarging the diameter of storage roller 100B. This allows the thickness of device 10 to be minimized.

Electronic devices with multiple rollers such as electronic device 10 of FIG. 17 and/or other devices 10 with internal storage rollers may, if desired, be provided with supporting members such as elongated bistable support members (e.g., strips of flexible tape such as structures 32 of FIGS. 3 and 4). The supporting members may run along the edges of display 14 (e.g., inactive display portions) as described in connection with FIGS. 3 and 4 and/or may be overlapped by active portions of display 14. As described in connection with FIG. 5, magnets 40 that are supported on housing 12 at the end of each roller may be used to help tension display 14 outwardly by magnetically attracting the bistable support members. In this type of arrangement, the bistable support members may be formed from material that is magnetically attracted to magnets 40 (e.g., a magnetic metal such as steel).

The end of display 14 of FIG. 17 and the other FIGS. may have wireless circuitry such as circuitry 44R of FIG. 6 that communicates with wireless circuitry such as wireless circuitry 44T of FIG. 6. Circuitry 44T and other circuitry 44 may be mounted in housing 12 of FIG. 17 or other device housing structures. This type of wireless circuit arrangement may also be used in configurations for device 10 of the type shown in FIGS. 15 and 16 and/or the device arrangements of the other FIGS.

In general, device 10 may have any suitable size. The lateral dimensions of device 10 may, for example be 1-100 cm, 10-1000 cm, more than 1000 cm, less than 500 cm, less than 25 cm, less than 5 cm, less than 1 cm, or other suitable dimensions. The thickness of device 10 (e.g., the unfolded thickness of a folding housing device) may be, for example 1-100 mm, more than 2 mm, more than 3 mm, more than 5 mm, less than 30 mm, less than 15 mm, less than 9 mm, less than 5 mm, less than 4 mm, less than 3 mm, less than 1 mm, or other suitable thickness.

The foregoing is merely illustrative and various modifications can be made to the described embodiments. The foregoing embodiments may be implemented individually or in any combination.

What is claimed is:

1. A foldable electronic device, comprising:
a first housing portion;
a second housing portion that is coupled to the first housing portion along a bend axis about which the first and second housing portions rotate;
a flexible display that overlaps the first and second housing portions and that bends along the bend axis when the first and second housing portions rotate between an unfolded planar state and a folded state; and
a support structure that extends between the first and second housing portions, wherein the support structure is configured to support the flexible display in the unfolded planar state and to allow the flexible display to expand in the folded state, the flexible display has a first end and a second end, the first end and the second end are separated by a first distance when the flexible display is in the folded state, and a central portion of the display is separated by a second distance when the flexible display is in the folded state.

2. The foldable electronic device defined in claim 1 wherein the support structure comprises movable support members that overlap the bend axis when the flexible display is in the unfolded planar state.

3. The foldable electronic device defined in claim 2 wherein the support structure further comprises spring mechanisms between the movable support structures.

4. The foldable electronic device defined in claim 3 further comprising:
a biasing member attached to an end of the support structure.

5. The foldable electronic device defined in claim 1 wherein the second distance is greater than the first distance.

6. The foldable electronic device defined in claim 5 wherein the support structure comprises movable support structures that each has a height that is between the first and second distances.

7. An electronic device, comprising:
a housing having a first portion and a second portion and having a window between the first portion and the second portion;
a roller in the first portion of the housing; and
a flexible display having an array of pixels, a first edge coupled to the roller, and a second edge, wherein the flexible display is configured to move from an unrolled state to a rolled state as it is wrapped around the roller, the first and second portions of the housing are separated by a gap when the flexible display is in the unrolled state, the first portion of the housing contacts the second portion of the housing when the flexible display is in the rolled state, and a portion of the array of pixels is visible through the window when the flexible display is in the rolled state.

8. The electronic device defined in claim 7 wherein the flexible display has third and fourth edges that extend between the first and second edges, the electronic device further comprising:
first and second support members that respectively run along the third and fourth edges.

9. The electronic device defined in claim 8 wherein at least one of the first and second support members is a bistable support member.

10. The electronic device defined in claim 9 wherein the bistable support member wraps around the roller when the flexible display is in the rolled state.

11. The electronic device defined in claim 8 wherein at least one of the support members is a metal strip.

12. The electronic device defined in claim 7 further comprising:
a printed circuit board inside the roller; and
components mounted to the printed circuit board.

13. An electronic device, comprising:
a housing;
a roller in the housing;
a flexible display coupled to the roller and configured be rolled around the roller to move from an unrolled state to a rolled state;
an electronic component within the roller; and
a transparent window, wherein the flexible display is visible through the transparent window in the rolled state.

14. The electronic device defined in claim 13 wherein the electronic component is selected from the group of components consisting of: an integrated circuit and a battery.

15. The electronic device defined in claim 14 wherein the flexible display has edges that extend perpendicular to the housing, the electronic device further comprising:
metal support structures that run along the edges of the flexible display.

16. The electronic device defined in claim 15 wherein the metal support structures are bistable and are configured to wrap around the roller when the flexible display is in the rolled state.

17. The electronic device defined in claim 13 further comprising:
at least one additional roller in the housing.

18. The electronic device defined in claim 13 wherein the transparent window comprises glass.

* * * * *